United States Patent [19]

Germano

[11] Patent Number: 4,553,061

[45] Date of Patent: Nov. 12, 1985

[54] PIEZOELECTRIC BIMORPH DRIVEN DIRECT CURRENT LATCHING RELAY

[75] Inventor: Carmen P. Germano, Lyndhurst, Ohio

[73] Assignee: General Electric Company, Schenectady, N.Y.

[21] Appl. No.: 619,672

[22] Filed: Jun. 11, 1984

[51] Int. Cl.[4] .............................................. H01L 41/08

[52] U.S. Cl. .................................... 310/332; 310/317; 310/358; 200/181

[58] Field of Search ................ 310/311, 317, 330–332, 310/357, 358, 359; 200/DIG. 20, 64, 67 R, 67 DA, 67 DB, 181, 325, 338, 154

[56] References Cited

U.S. PATENT DOCUMENTS

| | | | |
|---|---|---|---|
| 2,166,763 | 7/1939 | Mason | 310/331 X |
| 2,365,738 | 12/1944 | Williams | 310/332 X |
| 2,387,108 | 10/1945 | Arndt, Jr. et al. | 310/331 X |
| 3,109,901 | 11/1963 | Strauss | 200/67 DB |
| 3,760,203 | 9/1973 | Guntersdorfer | 310/331 X |
| 3,794,410 | 2/1974 | Elliott | 310/332 X |
| 3,840,758 | 10/1974 | Zoltan | 310/328 |
| 4,237,399 | 12/1980 | Sakamoto | 310/332 X |
| 4,403,166 | 9/1983 | Tanaka | 310/332 |

FOREIGN PATENT DOCUMENTS

| | | | |
|---|---|---|---|
| 783672 | 4/1968 | Canada | 200/181 |
| 450521 | 4/1968 | Switzerland | 200/67 DA |
| 1143822 | 2/1969 | United Kingdom | 310/330 |

*Primary Examiner*—Mark O. Budd
*Attorney, Agent, or Firm*—J. F. McDevitt; Philip L. Schlamp; Fred Jacob

[57] ABSTRACT

A direct current latching relay comprised of bender-type piezoelectric drive members each of which is a three terminal member formed of two piezoelectric plate elements separated by a conductive plane. Each piezoelectric plate element is separately electrically charged with an input pulsed d.c. switching signal of the same polarity as the pre-poling field previously induced in the piezoelectric plate element. By electrically charging one of the piezoelectric plate elements with a switching signal electric field of the same polarity as the pre-poling field, the bender-type drive members are member made to bend in one direction. Alternatively, by charging the opposite plate of the drive member again with a direct current electric charging field of the same polarity as the pre-poling field previously induced in the plate, the bender-type drive member can be caused to bend in the opposite direction. The bender-type piezoelectric drive member when bent engages and drives a push rod which actuates a snap-action switching contact mechanism from either an open circuit state or to a closed circuit state or vice versa. Pulsed direct current charging fields are applied to the piezoelectric plate element of the bender-type drive member and a high resistance discharge resistor is connected across each of the piezoelectric plate members so as to automatically discharge the plate members shortly after their excitation. As a result, no long term depolarization of the piezoelectric plate members occurs and because of the pulsed short term nature of the charging fields, no long term deformation (creep) develops in the plate elements over extended periods of usage of the relay.

21 Claims, 14 Drawing Figures

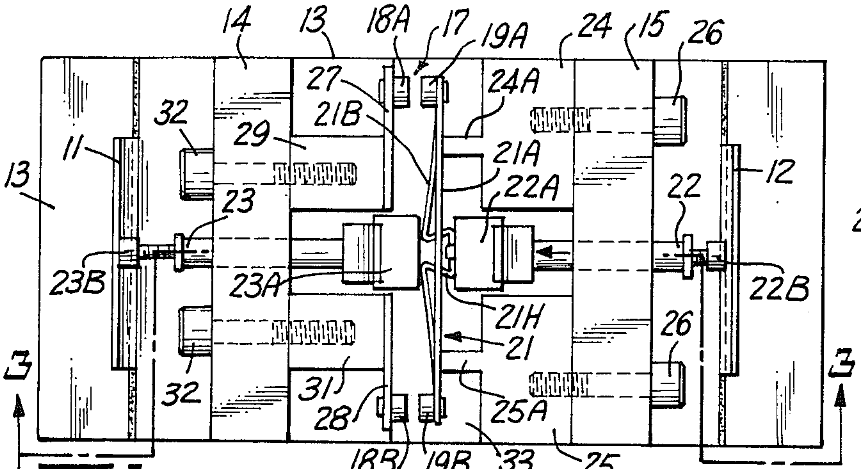
Fig. 1
OPEN
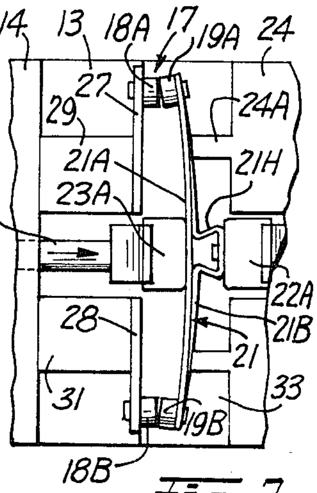
Fig. 2
CLOSED
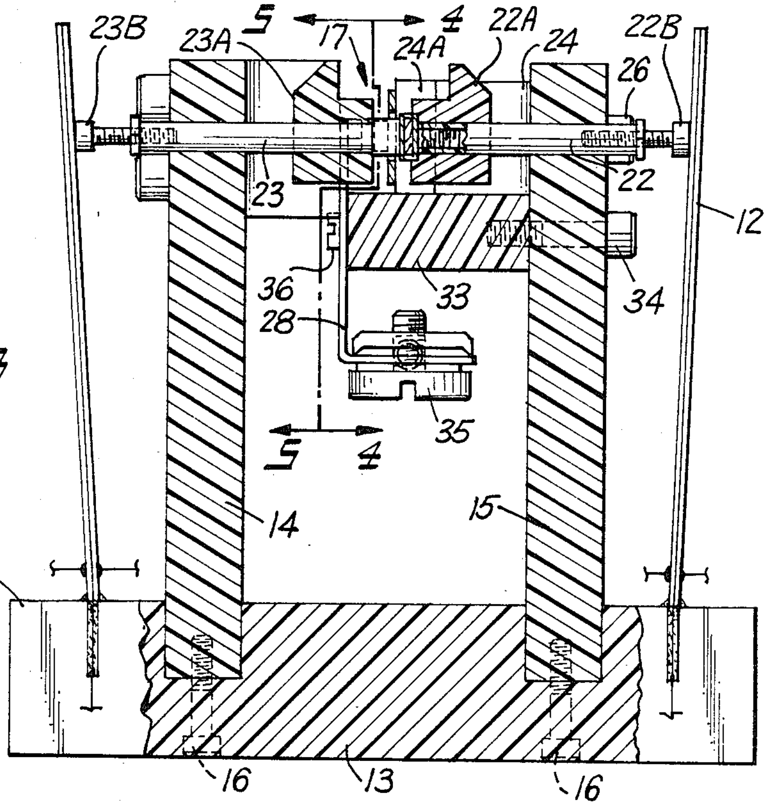
Fig. 3
Fig. 4
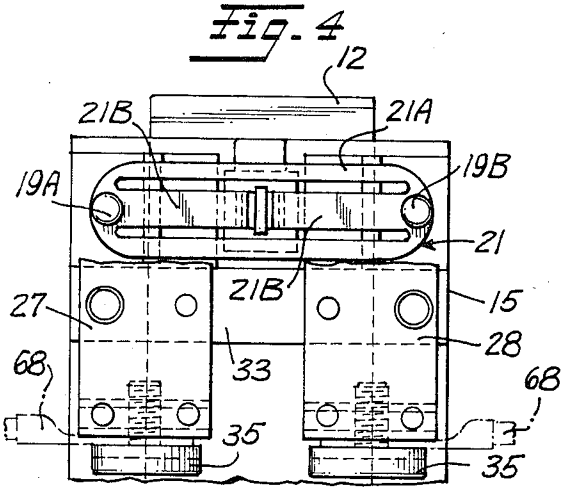
Fig. 5
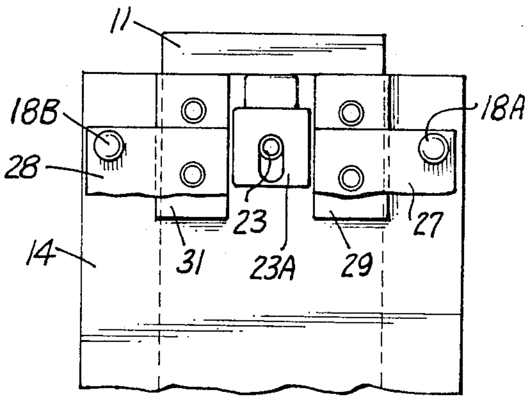

PULL
17
PUSH
POLING FIELD
SIGNAL FIELD
60~
A.C.
SUPPLY

SNAP ACTION
CONTACT SWITCHING
MECHANISM

POLING FIELD
SIGNAL FIELD
PULL
PUSH

Fig.10
OPEN
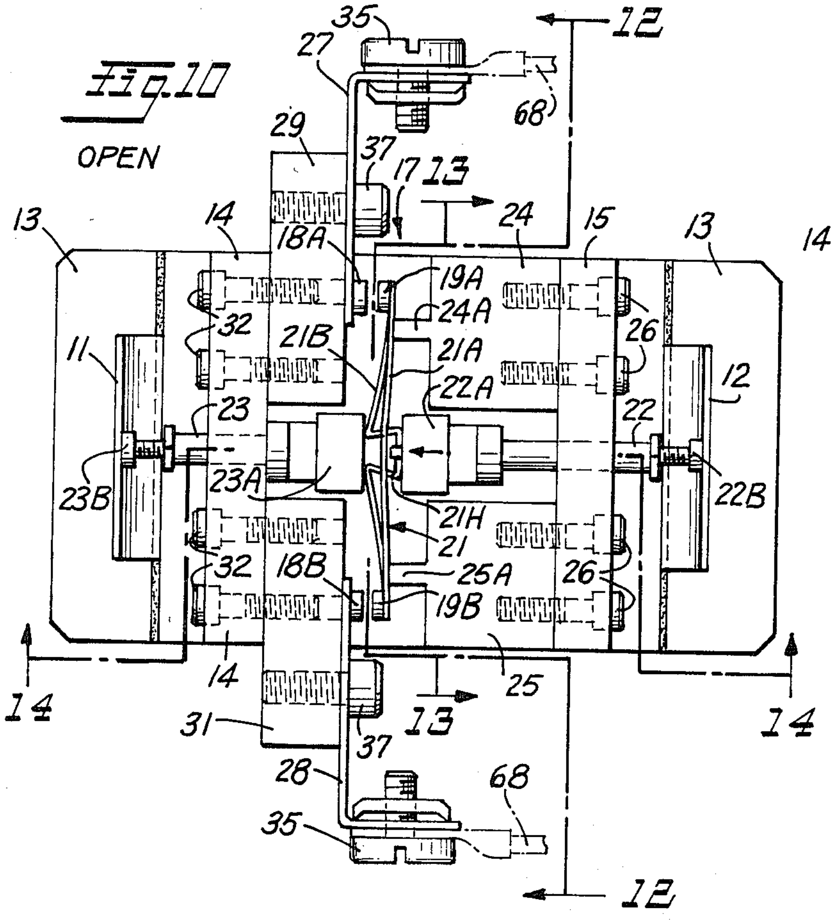
Fig.11
CLOSED
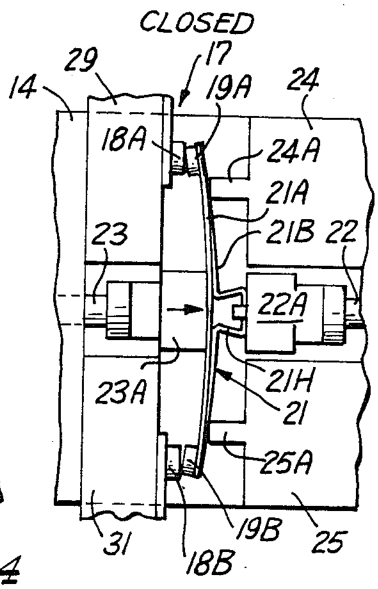
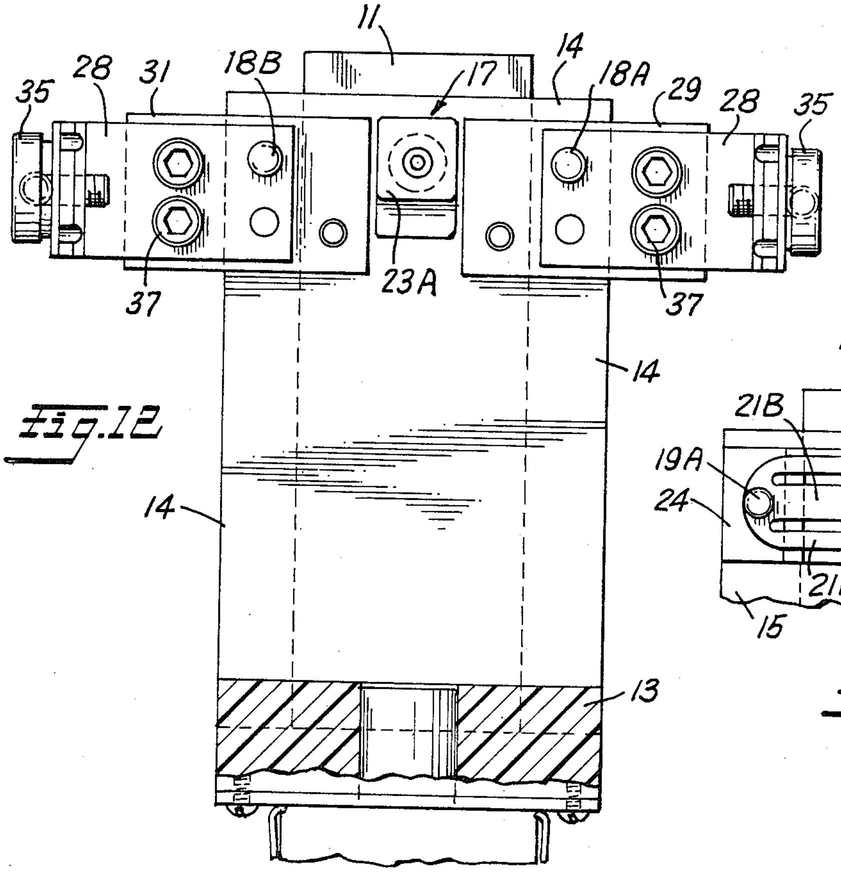
Fig.12
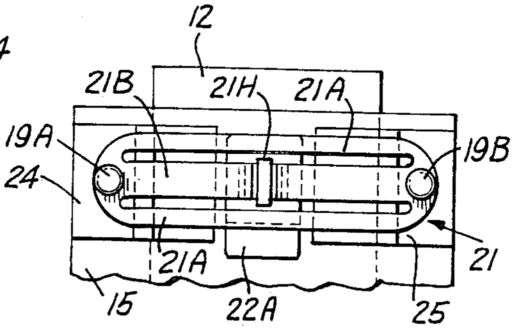
Fig.13

PIEZOELECTRIC BIMORPH DRIVEN DIRECT CURRENT LATCHING RELAY

TECHNICAL FIELD

This invention relates to latching relays of the type which when set in either a closed or open circuit condition, remain in that condition until reset to the opposite condition.

More specifically, the invention relates to direct current relays which are actuated by an input direct current electric potential and which employ a piezoelectric driving member in place of the conventional electromagnetic solenoid driving element.

BACKGROUND PRIOR ART PROBLEM

Historically, electrical relays and in particular power-rated relays, have been employed in switching situations where it is desired either to institute or interrupt electric current flow through a circuit. Conventionally, an electromagnetic solenoid operated relay has been used for this purpose wherein a small actuating signal current has been employed to either close or open the contacts of the power rated relay which controls current flow from a larger current source through the relay contacts to a circuit being supplied via the relay. In the case of a latching relay, the contacts of the latching relay when set in either a closed or open circuit condition, remain in that condition until reset to the opposite condition by subsequent actuation of the electromagnetic solenoid employed to drive the larger current rated contacts of the latching relay to their opposite closed or opened condition.

Relays which use piezoelectric drive elements offer several advantages over their electromagnetic solenoid driven counterparts. Typically, a piezoelectric driven relay requires lower current and dissipates very little power in comparison to the electromagnetic solenoid driven relay. In addition, piezoelectric driven devices have a very low mass structure thereby employing less space with less weight and in turn possess very short actuation times. Thus, fast acting relay switching is possible with smaller and lower weight devices which als dissipate less power and hence operate at lower temperatures. Unfortunately, previous attempts to provide piezoelectrically driven relays, particularly direct current actuated piezoelectric relays, have resulted in relays having poor performance characteristics. In the case of bender-type piezoelectric direct current driven relays, the prior art devices implemented in this manner possess severe performance limitations which are founded in the trade-offs between contact force, contact separation, depolarization and the uncertainty of contact position due to creep and temperature effects which build up over a period of continued relay usage.

Prior art piezoelectrically driven relay devices have been described, for example, in U.S. Pat. No. 2,166,763 issued July 18, 1939 for a "Piezoelectric Apparatus and Circuits". In this apparatus a relay device having a piezoelectric bender-type drive member comprised by two juxtaposed piezoelectric plate application of an electrical potential force between the input terminals to the device, one of the plate elements lengthens and the other shortens. As a result the bender-type drive member bends in the manner of a bimetallic thermostat so as to close the contacts of a switch comprised by a fixed contact and a movable contact mounted on the piezoelectric plate elements. In this arrangement, one of the piezoelectric plate elements will have the actuating potential applied in phase with its pre-poling electric field and the other piezoelectric plate element will have the actuating signal of opposite polarity with its prepolarization field. As a consequence, with this type of device, long term depolarization of either one or both piezoelectric plate elements will occur due to the depolarizing effects of the applied out of phase actuating signals. The same objectionable characteristics are present in the following prior art piezoelectrically driven bender-type switches and/or relay devices: U.S. Pat. No. 2,182,340—issued Dec. 5, 1939 for "Signalling System"; U.S. Pat. No. 2,203,332—issued June 4, 1950 for "Piezoelectric Device"; U.S. Pat. No. 2,227,268—issued Dec. 31, 1940 for "Piezoelectric Apparatus"; U.S. Pat. No. 2,365,738—issued Dec. 26, 1944 for "Relay"; U.S. Pat. No. 2,714,642—issued Aug. 2, 1955 for "High Speed Relay of Electromechanical Transducer Material"; U.S. Pat. No. 4,093,883—issued June 6, 1978 for "Piezoelectric Multimorph Switches"; U.S. Pat. No. 4,395,651—issued July 26, 1983 for "Low Energy Relay Using Piezoelectric Bender Elements"; and U.S. Pat. No. 4,403,166—issued Sept. 6, 1983 for "Piezoelectric Relay with Oppositely Bending Bimorphs".

In order to overcome the deficiencies of the known prior art piezoelectrically driven relays and switches described above, the present invention was devised wherein substantially no depolarization of the piezoelectric plate elements or long term deformation (known as creep) occurs during successive operations of the relay over extended periods of usage.

SUMMARY OF INVENTION

It is therefor a primary object of the present invention to provide a new and improved direct current latching relay of the type employing direct current actuated piezoelectric plate elements comprising at least one bender-type relay drive member and includes an improved signal excitation circuit and method of operation wherein the actuating signal applied to the piezoelectric plate elements always is in-phase with the prepoling electric field previously permanently induced in the piezoelectric plate elements.

Another object of the invention is to provide an improved circuit and method of operation for a direct current latching relay having the above-listed characteristics with means for applying a pulsed direct current charging signal of short duration to the piezoelectric plates that shortly thereafter are discharged whereby substantially no undesired long ter deformation of the piezoelectric plates comprising the bender-type drive member occurs over extended periods of relay use.

In practicing the invention a direct current latching relay is provided which employs a latching-type snap-action switch mechanism with a set of electric contacts that are selectively latched either in the open or closed condition in a snap-action manner upon successive actuations of the mechanism by suitable push rod means for initiating actuation of the mechanism. The improvement comprises providing at least one electrically actuated bender-type piezoelectric drive member having one end thereof secured to a common base member with the latching-type snap-action switch mechanism and the remaining free end engaging the push rod means. The invention further provides improved method and means for selectively operating the relay with a direct current electric excitation signal connected to the bender-type drive member for selectively and respectively electrically charging each piezoelectric plate element thereof with a direct current charging field which is in-phase with the pre-poling electric field previously permanently induced in the piezoelectric plate element whereby substantially no depolarization of the piezoelectric plate element occurs during successive operations of the relay.

A further feature of the invention is the provision of a method and means for applying a pulsed direct current charging field of short duration selectively and respectively to electrically charge each of the piezoelectric plate elements in a manner such that the polarity of the pulsed direct current charged field is in-phase with the pre-poling field and shortly thereafter discharging the plate elements so that substantially no undesired long term creep or deformation of the piezoelectric plate elements occurs over extended periods of use of the relay.

In a preferred embodiment of the invention, the snap-action switch contact mechanism is of the type wherein axial movement of the push rod means in a first direction results in snap-action setting of the relay contacts in either an open or closed condition and reverse movement of the push rod means results in snap-action setting of the relay contacts in the opposite condition. The relay includes at least two bender-type piezoelectric driven members the free ends of which engage opposite ends of the push rod means for respectively driving the push rod in either of the two directions to thereby selectively set the relay contacts in either an open or closed condition.

The push rod of the relay may have opposite ends thereof secured to a respective one of the two bender-type piezoelectric drive members so that it can be operated in a push-pull manner. The bender-type piezoelectric drive members preferably are conventional Bimorph benders each having two piezoelectric plate elements which are pre-poled in opposite directions with each plate element being selectively charged with a direct current excitation field which is in-phase with the pre-poling electric field whereby substantially no depolarization of the piezoelectric plate elements occurs over prolonged periods of relay operation. If desired, a plurality of sets of Bimorph bender-type peizoelectric drive members may be mechanically intercoupled to drive the push rod means in a push-pull manner. The mechanical coupling may be achieved either through coupling rod members or alternatively the bender-type piezoelectric drive members may be comprised by a plurality of physically adjacent peizoelectric plate elements all of which are electrically excited with direct current excitation fields which are in-phase with the pre-poling fields previously permanently induced in each of the piezoelectric plate elements.

BRIEF DESCRIPTION OF DRAWINGS

These and other objects, features and many of the attendant advantages of this invention will be appreciated more readily as the same becomes better understood from a reading of the following detailed description when considered in connection with the accompanying drawings, wherein like parts in each of the several figures are identified by the same reference characters, and wherein:

FIG. 1 a plan view of a piezoelectric driven direct current latching relay shown constructed according to the invention and in the open position;

FIG. 2 is a fragmentary plan view similar to FIG. 1, but showing the relay in the closed position;

FIG. 3 is vertical sectional view taken through the staggered sectional line 3—3 of FIG. 1;

FIG. 4 is a fragmentary vertical view taken along the staggered sectional line 4—4 of FIG. 3;

FIG. 5 is a fragmentary vertical view taken along the staggered sectional line 5—5 of FIG. 3;

FIG. 10 is a plan view of a modified form of direct current latching relay constructed according to the invention which employs a snap-action switching mechanism comprising a part of the relay and having electrical connectors extending from opposite sides of the mechanism with the snap-action relay contacts shown in the open position;

FIG. 11 is a fragmentary plan view, similar to FIG. 10 but showing the snap-action contacts in a closed position;

FIG. 12 is a vertical sectional view, partly in elevation, taken along the staggered sectional line 12—12 of FIG. 10;

FIG. 13 is a fragmentary vertical elevational view taken on the staggered sectional line 13—13 of FIG. 10.

BEST MODE OF PRACTICING THE INVENTION

Figures 6, 7, 8:
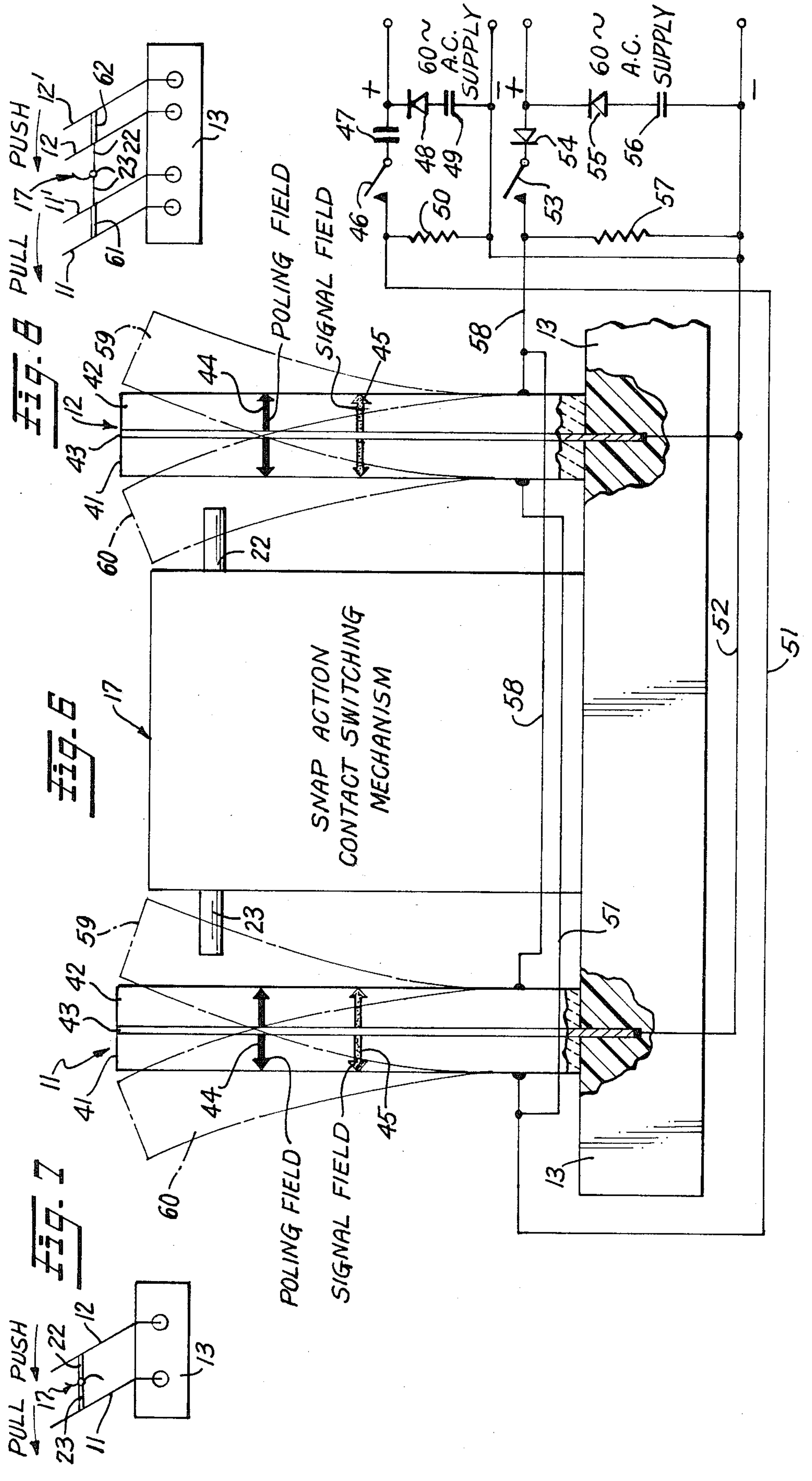
FIG. 6 is a partial schematic illustration of the direct current latching relay of FIG. 1 together with a unique signal excitation circuit illustrating the novel manner of charging the piezoelectric bender-type drive members employed in the relay.
FIG. 7 is a modified schematic illustration of another embodiment of a direct current latching relay of the invention showing a mechanical interconnection that can be used to obtain larger switching forces.
FIG. 8 is a modified schematic illustration showing still a different embodiment of the invention employing additional mechanical interconnections of a number of piezoelectric bender drive members whereby additional switching force can be obtained.
Figure 14:
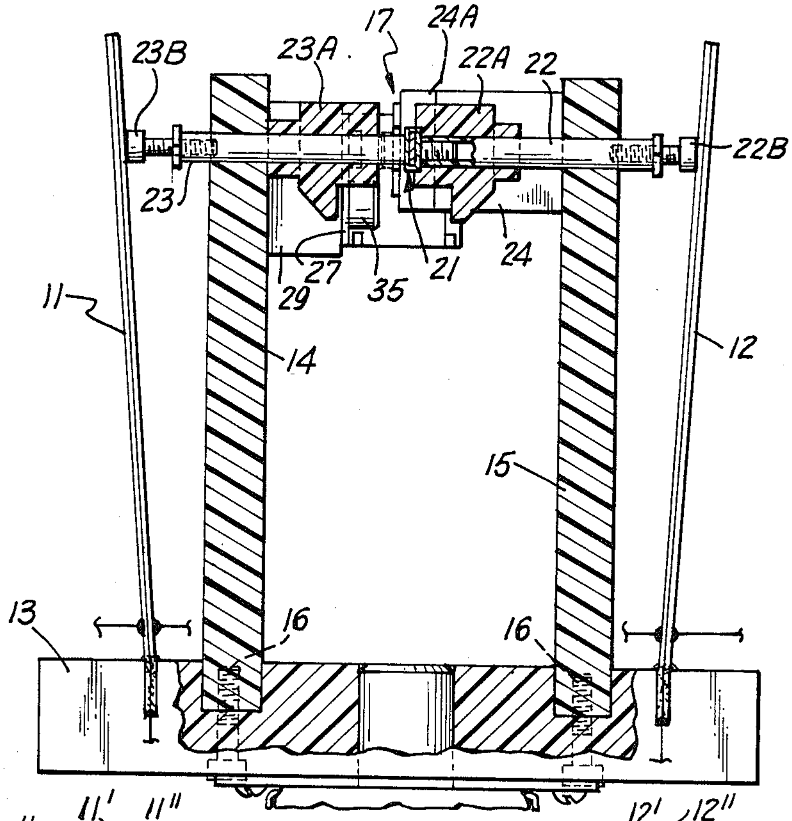
FIG. 14 is a vertical sectional view taken in elevation along the staggered sectional line 14—14 of FIG. 10.

FIG. 1 is a plan view of one form of a direct current latching relay constructed according to the present invention. As best seen in FIGS. 1 and 3, the improved latching relay is comprised by a set of two, spaced-apart, bender-type drive members 11 and 12 which are mounted in an insulating base member 13. The construction of the bender-type, piezoelectric drive members 11 and 12 will be described more fully hereinafter with relation to FIG. 6 of the drawings. In between the spaced-apart bender-type piezoelectric drive members 11 and 12 are a set of spaced-apart upright insulating pedestals 14 and 15 secured to insulating base member 13 by set screws 16. Physically disposed between the spaced apart insulating support pedestals 14 and 15 is a snap-action switch mechanism shown generally at 17.

Snap-action switch mechanism 17 is comprised by a set of two spaced-apart fixed relay contacts 18A and 18B which are electrically insulated one from the other. Coacting with the fixed contacts 18A and 18B are a set of spaced-apart movable relay contacts 19A and 19B which are electrically interconnected via a conductive spring frame member 21 best seen in FIG. 4 of the drawings. Frame member 21 is comprised by an outer elliptically-shaped frame portion 21A having a central opening therein across which an inner flexible spring arm portion 21B is disposed. The inner flexible spring arm portion 21B has a horseshoe-shaped dimple 21H formed in its center portion. The bottom of the horseshoe-shaped dimple 21H engages an insulating end portion 22A of a linarly reciprocal drive rod 22 whose opposite insulating end 22B is engaged by the Bimorph bender-type drive member 12 as best seen in FIG. 3. The open mouth of the horseshoe-shaped dimple 21H on inner flexible spring arm portion 21B is engaged by the insulating end 23A of a push rod 23, the opposite free end of which is engaged by the bender-type piezoelectric drive member 11. The push rods 22 and 23 are axially aligned and are supported in axially aligned openings in the upper ends of the respective upright mounting pedestals 15 and 14 within which they are axially movable A set of mounting blocks 24 and 25 are secured to the outer end of the upright mounting pedestal 15 by set screws 26 on each side of the opening accomodating the push rod 22. Blocks 24 and 25 have respective projections 24A and 25A formed thereon which extend to and engage the outer elliptically-shaped portion 21A of the movable contact spring frame member 21. By reason of this construction, upon the left-hand push rod 23 being axially pushed from its position shown in FIG. 1 where the relay contacts 18A, 19A and 18B, 19B are in their open circuit condition, to the right, the inner flexible spring arm portion 21B will be suddenly snapped from the position shown in FIG. 1 to the position shown in FIG. 2 where the relay contacts 18A, 19A, and 18B, 19B will be closed. This snap-action movement occurs as a result of the resilient spring nature of flexible spring arm portion 21B and the resistance provided by the projections 24A and 25A against movement of the outer elliptically-shaped portion 21A of the movable contact spring frame member 21. As a result of this resistance, and pressure exerted by the insulated end 23A of push rod 23 when moved to the right on the open mouth portion of the horseshoe-shaped dimple 21H of inner flexible spring arm portion 21, the inner flexible spring arm portion 21 after passing through a median position will immediately snap to the closed position shown in FIG. 2 where the movable contacts 19A and 19B secured to the ends of the movable contact spring frame member 21 will be closed on the fixed contacts 18A and 18B.

As best shown in FIGS. 1, 2 and 5 considered in conjunction with FIG. 3, the fixed contacts 18A and 18B are secured to respective bus bars 27 and 28 which in turn are mounted on insulating block members 29 and 31 secured to the insulating upright pedestal 14 by set screws 32. The respective bus bars 27 and 28 are electrically conductive and provide a highly conductive current paths to the fixed relay contacts 18A and 18B to which they are respectively connected. For this purpose, each of the bus bars 27 and 28 extends below the level of the snap-action movable contact spring frame member 21. As best shown at 28 in FIG. 3, bus bars 27 and 28 are further physically supported by an additional insulating support member 33 secured to the upright insulating pedestal 1 by set screws 34 and to which the bus bars 27 and 28 are secured by set screws 36. The lower ends of the bus bars are bent to extend at right angles to the main body of the bus bars and form a dogear to which a screw cap 35 is threadably secured for connection of input leads to the relay device.

FIG. 6 is a schematic functional diagram of a new and improved direct current latching relay constructed in accordance with FIGS. 1–5 and is useful in explaining operation and particularly the novel method of excitation of the relay device. In FIG. 6, the piezoelectric bender-type drive members are shown at 11 and 12 together with the snap-action contact switching mechanism 17 mounted on base member 13. In the preferred embodiment of the invention, Bimorph bender-type piezoelectric drive elements are employed; however, the invention can be practiced with a unimorph, multimorph or multi-layer piezoelectric bender-type drive member, and even multiple spaced-apart benders, as will be apparent to the reader hereafter. Bimorphs are commercially available bender-type peizoelectric members manufactured and sold by a number of suppliers including Vernitron Corporation of Long Island, New York.

For a more detailed description of the construction and operation of bender-type piezoelectric drive members, reference is made to a paper entitled "Flexure Mode Piezoelectric Transducers" by Carmen P. Germano appearing in the IEEE Transactions on Audio and Electro Acoustics, Volume AU–19, No. 3, March 1971, pages 6–12. Briefly, however, it can be said that flexure mode (bender-type) piezoelectric transducers have been known for a number of years and have been successfully used in a large number of applications. This is due to the ability of such transducers to generate high output voltages from a low mechanical impedance source, or conversely to develop large displacement at low levels of electrical excitation. The devices operate through the use of a pair of suitably oriented piezoelectric plates which act on the principle of opposition to obtain built-in mechanical magnification of motion. The piezoelectric plate elements may be fabricated from a suitable polycrystalline ceramic such as barium titanate, lead zirconate and the like or could be fabricated from naturally occuring piezoelectric materials such as quartz or Rochelle salt or materials such as ammonium dihydrogen phosphate. Other known materials exhibiting piezoelectric properties also could be used.

In FIG. 6, each of the respective bender-type piezoelectric drive members 11 and 12 comprise Bimorph bender-type drive members wherein two piezoelectric plate elements 41 and 42 fabricated from a suitable piezoelectric substance such as those noted above are sandwiched together with an intermediate conductive plate, foil or coating into a unitary sandwich-like structure. The unitary structure thus comprised are bonded to the base member 13 in spaced-apart relationship to the snap-action contact switching mechanism 17 and with the free ends thereof adjacent to and engaging the free ends of the push rods 22 and 23. At this point, if not prior thereto, the piezoelectric plate elements 41 and 42 are pre-poled in a known manner with a poling electric field having the polarity indicated by the darkened arrows 44. The pre-poling of piezoelectric plate elements is a well known phenomenon in the art and serves to induce the piezoelectric properties of the plate elements. It is this pre-poling electric field which in prior art piezoelectrically driven bender-type relay devices is altered due to depolarization after a continued period of usage and thus makes the devices unreliable in service.

In order to overcome the undesirable effects resulting from depolarization of the piezoelectric plate elements, the present invention provides a new and improved method and means for electrically exciting the piezoelectric plate elements 41 and 42 in a manner such that no long term depolarization of the piezoelectric plate elements can take place. The manner in which this is achieved in the present invention is through the provision of a novel excitation circuit for each plate element of the bender-type drive members which applies an input excitation signal (shown by the grey arrows 45) to the plate members 41 and 42 that always is in-phase with the previously induced pre-poling electric field (shown by dark arrows 44).

The particular excitation circuit shown in FIG. 6, for example, comprises a pulse acutated switch shown schematically at 46 which serves to apply a pulsed direct current electric signal field to plates 41. The d.c. potential is derived from a rectifying network comprised by diodes 47 and 48 and filter capacitor 49 supplied from a suitable source of alternating current and is applied to plate elements 41 via a load/discharge resistor 50. The load/discharge resistor 50 is connected through a conductor 51 across the plate elements 41 via terminals formed on the left-hand surfaces of plate elements 41, central conductor plates 43 and return conductor 52. In a similar manner, the plate element 42 in each of the piezoelectric drive members 11 and 12 are supplied with an exciting signal field via a pulse operated switch 53 from a d.c. source comprised by diode rectifiers 54 and 55 and filter capacitor 56 supplied from a conventional alternating current supply system. It is of course possible to use other d.c. sources such as a battery to provide the pulsed d.c. excitation field via the switches 46 and 53. The d.c. field supplied via the pulsing switch 53 appears across a load/discharge resistor 57 and is applied via conductor 58 to the piezoelectric plate elements 42 in each of the bender-type drive members 11 and 12, respectively. Again this field is applied via inpu terminals formed on the right-hand surfaces of plate elements 42 across the plate elements via the central conductive plate 43 and return conductor 52. In both excitation circuits, it will be seen that the pulsed direct current excitation signal fields will be in-phase with the previously applied pre-poling fields as shown by the arrows 45 and 44, respectively. The switches 46, 53 while schematically illustrated as manually operated switches could be implemented with solid state switches under the control of a suitable pulse timing circuit controlled by an operator (not shown).

In operation, assume that it is desired to switch the d.c. latching relay from its open circuit condition shown in FIG. 1 to its closed circuit condition shown in FIG. 2. To accomplish this, the drive rod means comprised by drive rods 22 and 23 must be moved from the position shown in FIG. 1 to the right to the position shown in FIG. 2. For this purpose, the bender-type piezolectric drive members 11 and 12 must be excited so as to cause them to bend from their neutral or unexcited central position shown in solid lines in FIG. 6 to the right to the position shown in phantom lines at 59. To do this, pulse actuated switch 53 is closed for a short period thereby applying a pulsed d.c. excitation signal field across the plate elements 42 in each of the bimorph bender-type piezoelectric drive members 11 and 12. The application of the d.c. excitation signal field which is in-phase with the pre-poling field will cause a reorientation of the crystalline structure of the plate elements 42 in such a manner that bending of the bimorph drive members 11 and 12 takes place to the right to the phantom-like positions shown at 59. In travelling to this position, drive member 11 will push the push rods 23, 22 to the right resulting in snap-action switching of the relay contacts from their open circuit condition shown in FIG. 1 to the closed circuit condition shown in FIG. 2. It is estimated that the switching action will be on the order of one second or less due primarily to the design of the snap-action switching mechanism 17 which requires a finite time period to move from its open circuit to its closed circuit condition. Thereafter, automatic opening of the switch 53 will allow the high resistance load/drain resistor 57 to drain off the excitation field charge from the plate elements 42 thereby allowing the bimorph drive members 11 and 12 to return to their neutral, unexcited upright position shown in solid lines in FIG. 6. This action leaves the relay contacts latched in their closed condition as shown in FIG. 2 where they will remain unless and until they are switched to their open condition as shown in FIG. 1.

To switch the d.c. latching relay back to its open circuit condition, the pulse operated switch 46 is closed thereby applying a pulsed d.c. excitation signal to the piezoelectric plate elements 41 of each of the bender-type drive members 11 and 12. Here again the applied excitation signal field will be in-phase with the pre-poling field as shown by the arrows 45 and 44. As a result, the bender-type drive members 11 and 12 will be bent from their upright neutral or unexcited position shown in solid lines to the left as shown in phantom lines at 60. This will result in the bimorph drive member 12 engaging the end of the push rod 22 and pushing it to the left thereby causing the snap-action contact switching mechanism 17 to be switched from its closed condition shown in FIG. 2 to its open condition shown in FIG. 1.

It should be expressly noted at this point in the description that the pulsed, direct current excitation circuitry is such that the excitation field applied to the piezoelectric plate members 41 and 42 of each of the bender-type drive members 11 and 12 is always in-phase with the poling field previously applied to the piezoelectric plate members 41 and 42. Consequently, there is no opportuity for long term depolarizing effects to take place since during actuation of the d.c. latching relay, the applied activating signal field is always in-phase with the pre-poling field. This is in contrast to prior art bender-type piezoelectric driven relays wherein the applied signal field either in one direction or the other to one of the two places in the Bimorph bender was out of phase with the pre-poling field in order for the device to operate. As a consequence, after a period of usage, depolarization takes and such devices become unreliable in service.

From the foregoing description of construction and operation, it will be appreciated that the invention provides a direct current latching relay device which employs two bender-type piezoelectric drive members, each of which is comprised by two piezoelectric plate elements with an interleaved conductive plane interconnected to operate as a three terminal device. The piezoelectric plates of each drive member always are driven with a direct current excitation pulse of the same polarity as their pre-poling field, and can be driven with a signal of any magnitude up the dielectric breakdown of the material to either close a pair of relay contacts to thereby complete an external circuit, or to open a pair of relay contacts and open the external circuit. Thus, opening and closing of the relay contacts is achieved by exciting different sets of piezoelectric plates of the bender-type drive members always with a signal d.c. excitation field which is in-phase with the pre-poling field previously applied to the piezoelectric plate elements. Since the two driven plate elements of the bender-type drive members are poled in a manner to allow for motion in a desired direction only when the polarity of the supplied exciting d.c. signal is in-phase with its pre-poling field, there is no opportunity for depolarization of the piezoelectric ceramic plate elements.

Although only one piezoelectric plate element of each bender-type drive member is excited at any given time, bending still occurs in in a manner similar to a bimetallic thermostat since one of the plate elements is activated and the other is not. Because the driven plate attempts to contract along its length, and because of the restraint offered by the unexcited plate as well a the interleaved conducting plane 43 to which the excited or driven plate element is bonded, the resultant effect is to produce a bending deflection as depicted in FIG. 6. Conversely, when the second or opposite plate is excited or driven, a bending deflection of comparable extent will be effected but in the opposite direction.

Another considerable advantage of the novel d.c. latching relay according to the invention is the elimination of creep which results in a lasting undesired deformation of the bender-type piezoelectric drive member in one direction or the other after an extensive period of use. This phenomenon has been observed with prior art peizoelectric ceramic driven relay devices operated by static d.c. excitation fields required to hold the devices in on state or the other (i.e. open or closed). With the invention, excitation of the piezoelectric plate elements is required only for a short period or duration of time. This is made possible by the snap-action closing (or opening) of the relay contacts 18A, 19A and 18B, 19B comprising a part of the snap-action contact switching mechanism 17. Hence, no continued (static) d.c. excitation of either of the piezoelectric plate elements is required since the activating d.c. excitation signal applied to each piezoelectric plate element, whether the device is being driven in either a closure or opening mode, is of a pulsed extremely short duration long enough only to assure tripping the snap-action contact switching mechanism 17. This may require only one second or less, after which the d.c. exciting signal field can be and is removed automatically. This is accomplished in the FIGS. 1–6 embodiment of the invention, for example, by the pulsed operating nature of the switches 46 and 53 and the provision of the high resistance load/drain resistors 50 and 57. The pulsed nature of the d.c. excitation signal subjects the piezoelectric plate elements 41, 42 to only short duration electrically induced stresses. Afer the snap-action switch mechanism 17 has been switched to its opposite state, these stresses are relaxed automatically by discharge through resistors 50 and 57 which provide a high resistance discharge path for the electric charges built-up on the piezoelectric plate elements 41 and 42.

FIG. 7 is a schematic functional diagram of a variation of the novel direct current latching relay shown in FIG. 6 wherein the ends of the push rods 22 and 23 of the snap-action contact switching mechanism 17 are fixed by gluing, threaded screw attachment or other similar attachment means to the free ends of the respective bender-type piezoelectric drive members 12 and 11. By this expedient, push-pull double action switching of the snap-action contact switching mechanism whereby both bender-type drive members 11 and 12 are effective in driving/pulling the push rods 22, 23 thereby achieving a greater switching force, irrespective of whether the relay device is being closed or opened. This greater switching force in turn can be translated into actuation of a larger snap-action contact switching mechanism having a greater power rating for a given size bender-type drive member. Alternatively, with the same size and rated bender-type drive members, a faster response time in the switching action can be obtained than that achievable with the FIGS. 1–6 arrangement wherein only one of the bender-type piezoelectric drive members 11 or 12 is effective to switch the snap-action contact switching mechanism 17 from either its closed or opened condition to the opposite condition.

FIG. 8 is a schematic functional illustration of still another alternative embodiment of the invention. In FIG. 8, a set of two bender-type piezoelectric drive members 11 and 11' are interconnected by a coupling rod 61 with the push rod 23 of drive member 11' being connected to one side of the snap-action contact switching mechanism. On the opposite side of the snap-action switching mechanism a set of two bender-type drive members 12 and 12'likewise are interconnected by a coupling rod 62 with the push rod 22 of the snap-action switching mechanism being connected to one surface of the drive member 12. In this manner, increased switching force can be achieved over that accomplished with the arrangement shown in FIG. 7. In this arrangement, as with that shown in FIG. 7, additional increased pushing force is achieved by the interconnection of the dual sets of bender-type drive members 11, 11' and 12, 12' with the push rods 22 and 23 of the snap-action switching mechanism 17 so as to provide both pushing and pulling force while switching from one condition, either on or off, to the other.

Figure 9:
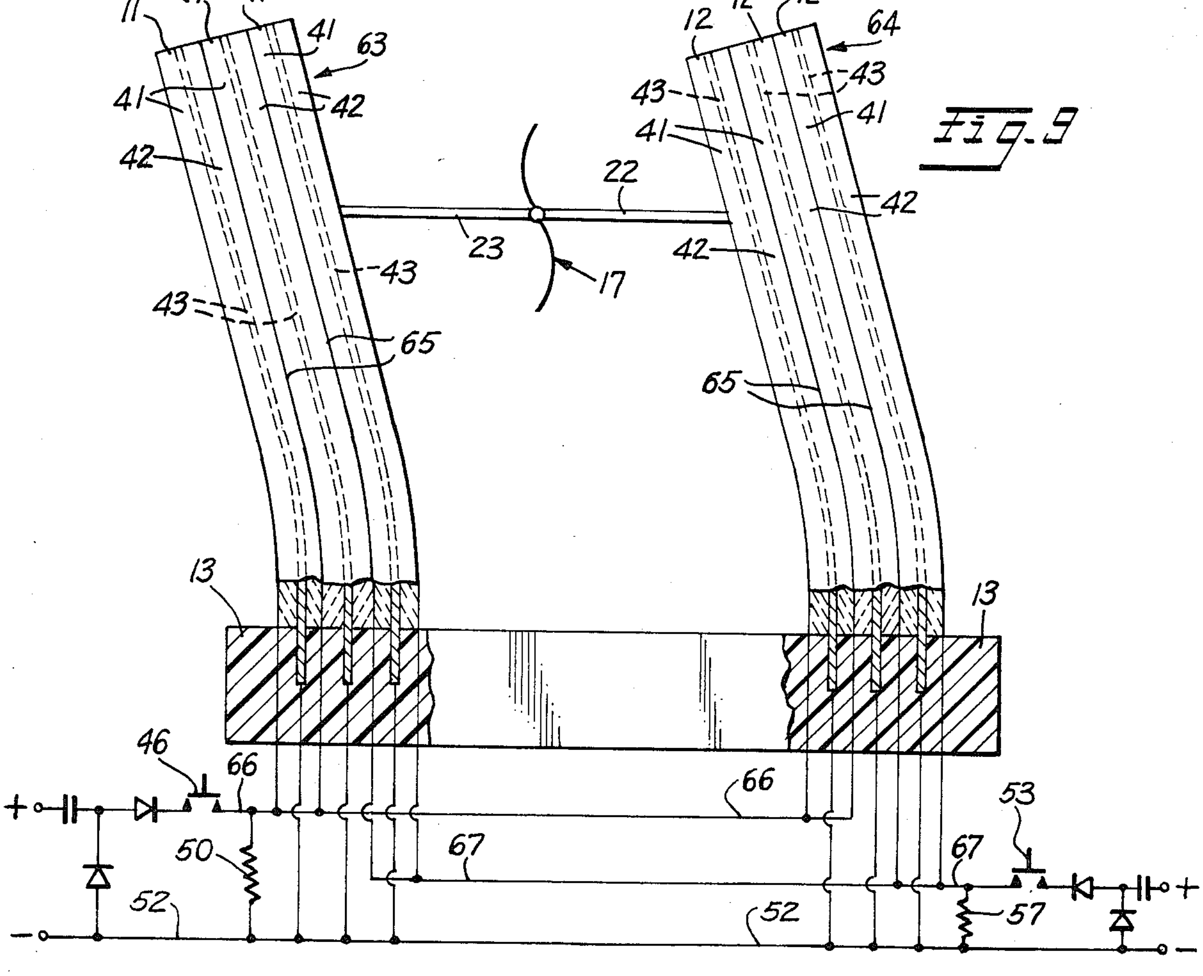
FIG. 9 is still another modified schematic illustration of an embodiment of the invention employing multi-layer bender-type drive members.

FIG. 9 is a schematic functional illustration of still another embodiment of the invention wherein multi-layer bender-type piezoelectric drive members 63 and 64 are employed to obtain an increase switching force for the snap-action contact switching mechanism 17. The multi-layer bender-type drive member 63 is comprised by three sets of Bimorph bender-type piezoelectric drive members of the same construction as described earlier with reference to FIG. 6 of the drawings and wherein the adjacent sets 11, 11' and 11'' are juxtaposed immediately one next to the other with an intervening insulating layer or coating 65 for electrically isolating one set from the other. It will be apparent that two, three or any number of such adjacent sets of bender-type piezoelectric drive members could be arrayed together up to a practical limit. The practical limit is imposed where the effective increased bending force due to an additional bender-type drive member diminishes to the point where the cost of the additional set would offset any infinitesimal increase in bending force. Size and space constraints also enter into the determination of the practical limit.

The multi-layer drive member 64 likewise is comprised of a set of three juxtaposed bender-type piezoelectric drive members 12, 12' and 12'' similar to those described in FIG. 6 and which are electrically isolated one from the other by the intervening insulating layer or coating 65. The push rod 23 comprising a part of the snap-action contact switching mechanism 17 is secured to the inside surface of piezoelectric plate element 42 comprising a part of the third drive member 11'' of multi-layer device 63 and the push rod 22 is secured to the inside surface of piezoelectric plate element 41 comprising a part of the Bimorph 12 in multi-layer device 64.

Electrical excitation of the two multi-layer devices shown in the FIG. 9 arrangement is achieved via a pulse operated switch 46 connected to a suitable d.c. source across a load/discharge resistor 50 of high resistance value and connected in parallel to all of the piezoelectric plate elements 41 employed in the multi-layer bender-type drive members 63 and 64. Similarly, a pulse operated switch 53 is connected between a d.c. source across load/discharge resistor 57 and conductor 67 in parallel to all of the piezoelectric plate elements 42 in each of the multi-layer bender-type drive members 63 and 64.

In operation, the multi-layer bender-type driven latching relay shown in FIG. 9 will function in a manner similar to that described with relation to FIG. 6 but because of the multiplicity of sets of interacting bender-type drive members, increased switching force is provided whereby larger and physically bigger snap-action contact switching mechanism 17 may be driven. In operation, the insulating coatings 65 between each set of adjacent bender-type drive sections 11, 11', etc. will prevent electrical interaction between the adjacent drive sections. Similarly, the high resistance value resistors 50 and 57 will serve to discharge electrical potential built up on the respective peizoelectric plate elements 41 and 42 intermediate each pulsed actuation of the multi-layer d.c. latching relay. Again, as in FIG. 6, the polarity of the excitation signal potentials applied to the respective piezoelectric plate elements 41 and 42 are in-phase with the pre-poling fields previously applied to these elements, so that no long term depolarization of the piezoelectric plate elements can take place. Further, because of the pulsed nature of the d.c. excitation signal required to switch the latching relay from one of its operating states to the other, no long term creep or deformation is allowed to develop over extended periods of usage.

FIGS. 10–14 of the drawings illustrate another embodiment of a direct current latching relay constructed according to the invention which is somewhat different in design configuration but otherwise includes all of the elements employed in the embodiment of the invention shown and described with relation to FIGS. 1–6 of the drawings. For this reason, like parts in each of the several figures have been identified by the same reference character and function in precisely the same manner.

The most significant difference between the embodiment of the invention shown in FIGS. 10–14 and that illustrated and described with relation to FIGS. 1–6, is best shown in FIGS. 10 and 12 wherein it will be seen that the screw caps 35 secured to the dog-ear or bent ends of supply bus bars 27 and 28 extend outwardly to both sides of the body of the snap-action contact switching mechanism 17. For this purpose, the insulating mounting blocks 29 and 31 for each of the supply bus bars 27 and 28, respectively, are elongated and extend outwardly to each side of the snap-action switching mechanism 17. The elongated mounting blocks 29 and 31 are secured to the insulating upright pedestal member 14 by set screws 32 in a manner such that the fixed relay contacts 18A and 18B that are physically and electrically connected to the respective supply bus bars 27 and 28, are disposed opposite the movable contacts 19A and 19B. By this arrangement, access for a technician to the screw cap connector 35 for connection of the input supply conductors 68, is greatly facilitated. This is in contrast to the FIG. 1-FIG. 6 arrangement wherein a technician must reach under the snap-action switch mechanism 17 in order to make connection of the supply conductors 68 to screw cap connectors 35 as best shown in FIG. 4.

INDUSTRIAL APPLICABILITY

The invention provides new and improved piezoelectric driven direct current latching relays for use in residential, commercial and industrial electrical distribution and control systems. The improved relays use piezoelectric drive elements which offer several potential advantages over prior art electromagnetic driven d.c. relays. The improved devices typically require lower current and dissipate very little power. As a result, substantially lower heat losses are produced and they are cheaper to operate. Further, the improve devices make available low mass structures which in turn lead to very short acutation times and require smaller space in which to be mounted than do their electromagnetic counterparts. Additionally, the devices have lower initial construction costs From the foregoing description it will be appreciated that the invention provides new and improved direct current actuated latching relays of the type employing piezoelectric bender-type plate elements as relay drive members. The invention provides improved circuitry and methods of excitation wherein the actuating direct current signal applied to the piezoelectric bender-type plate elements always is in-phase with the pre-poling electric field previously permanently induced in the piezoelectric plate elements. Further, the direct current latching relays constructed in the above described manner are actuated with a pulsed direct current switching signal of short duration and the built up electric charge on each piezoelectric plate member is bled off and automatically discharged intermediate each pulsed actuation. Consequently, no undesired long term deformation (warp) of the piezoelectric plate elements employed in the bender-type drive members occurs over extended periods of relay usage.

Having described several embodiments of a new and improved piezoelectric driven direct current latching relay constructed in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A direct current latching relay including in combination a pair of electrically actuated bender-type piezoelectric drive members, a latching type snap-action switch mechanism having a set of electrical contacts that are selectively latched to remain either in the open or the closed condition in a snap-action manner upon successive actuation of the switch mechanism, a push rod member for actuating the snap-action switch mechanism and engaged by the free end of the bender-type piezoelectric drive members whereby bending of the bender-type drive members selectively operates the snap-action switch mechanism and selectively operable direct current electric excitation circuit means connected to said bender-type drive members for selectively and respectively exciting each piezoelectric plate element thereof with a direct current excitation field which is always in-phase with the prepoling electric field previously permanently induced in the piezoelectric plate element whereby substantially no depolarization of the piezoelectric plate element occurs during successive operation of the relay, wherein the snap-action switch mechanism is of the type wherein axial movement of the push rod member in a first direction results in snap-action setting of the relay contacts in either an open or closed condition and reverse movement of the push rod member results in snap-action setting of the relay contacts in the opposite condition and wherein the free ends of said bender-type piezoelectric drive member engage opposite ends of the push rod member for respectively driving the push rod member in either of the two directions to thereby selectively set the relay in either an open or closed position.

2. A direct current latching relay according to claim 1 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the piezoelectric bender-type drive member occurs over extended periods of relay use.

3. A direct current latching relay according to claim 1 wherein the push rod means has the opposite ends thereof secured to a respective one of the two bender-type piezoelectric drive members so that it can be operated in a push-pull manner and wherein the bender-type piezoelectric drive members are two element bender-type piezoelectric drive members each having two piezoelectric plate elements which are pre-poled in opposite directions with each plate element being selectively excited with a direct current excitation field which is in-phase with the pre-poling electric field whereby substantially no depolarization of the piezoelectric plate elements occurs over prolonged periods of relay operation.

4. A direct current latching relay according to claim 3 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the piezoelectric bender-type drive member occurs over extended periods of relay use.

5. A direct current latching relay according to claim 3 wherein there are a plurality of sets of bimorph bender-type piezoelectric drive members mechanically intercoupled to drive the push rod means in a push-pull manner.

6. A direct current latching relay according to claim 5 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the piezoelectric bender-type drive member occurs over extended periods of relay use.

7. A direct current latching relay according to claim 1 wherein the electrically actuated bender-type piezoelectric drive member is a multi-layer bender-type piezoelectric drive member comprised by a plurality of physically adjacent piezoelectric plate elements each of which is respectively electrically excited with a direct current excitation signal field which is in-phase with the pre-poling field previously permanently induced in the piezoelectric plate element whereby substantially no depolarization of the piezoelectric plate elements occurs over prolonged periods of operation of the relay.

8. A direct current latching relay according to claim 7 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the piezoelectric bender-type drive member occurs over extended periods of relay use.

9. A direct current latching relay according to claim 7 wherein the snap-action switch contact mechanism is of the type wherein axial movement of the push rod means in a first direction results in snap-action setting of the relay contacts in either an open or closed condition and reverse movement of the push rod means results in snap-action setting of the relay contacts in the opposite condition and wherein the relay includes at least two multi-layer bender-type piezoelectric drive members the free ends of which engage opposite ends of the push rod means for respectively driving the push rod means in either of the two directions to thereby selectively set the relay in either an open or closed condition.

10. A direct current latching relay according to claim 9 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the piezoelectric bender-type drive member occurs over extended periods of relay use.

11. A direct current latching relay according to claim 9 wherein the push rod means has the opposite ends thereof secured to respective one of the two multi-layer bender-type piezoelectric drive members so that it can be operated in a push-pull manner and wherein th multi-layer bender-type piezoelectric drive members are juxtaposed multiple two element bender-type piezoelectric drive members each electrically insulated one from the other and each having two piezoelectric plate elements which are pre-poled in opposite directions with each plate element being selectively excited with a direct current excitation field which is in-phase with the previously applied pre-poling electric field whereby substantially no depolarization of the piezoelectric plate elements occurs over prolonged periods of relay operation.

12. A direct current latching relay according to claim 11 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the piezoelectric bender-type drive member occurs over extended periods of relay use.

13. In a direct current latching relay of the type having a latching-type snap-action switch mechanism with a set of electrical contacts that are selectively latched to remain either in the open or the closed condition in a snap-action manner upon successive actuations of the snap-action switching mechanism by a push rod member for initiating actuation of the snap-action switch mechanism; the improvement comprising, a pair of electrically actuated bender-type piezoelectric drive members having one end thereof secured to a common base member with said latching-type snap-action switch mechanism and the remaining free end engaging the push rod, member and selectively operable direct current electric excitation circuit means connected to said bender-type drive members for selectively and respectively exciting each piezoelectric plate element thereof with a direct current excitation field which is always in-phase with the pre-poling electric field previously permanently induced in the piezoelectric plate element whereby substantially no depolarization of the piezoelectric plate element occurs during successive operation of the relay, wherein the snap-action switch mechanism is of the tyPe wherein axial movement of the push rod member in a first direction results in snap-action setting of the relay contacts in either an open or closed condition and reverse movement of the push rod member results in snap-action setting of the relay contacts in the opposite condition and wherein the free ends of said bender-type piezoelectric drive members engage opposite ends of the push rod member for respectively driving the push rod member in either of the two directions to thereby selectively set the relay in either an open or closed condition.

14. A direct current latching relay according to claim 13 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the peizoelectric bender-type drive member occurs over extended periods of relay use.

15. A direct current latching relay according to claim 13 wherein the push rod means has each of the opposite ends thereof secured to a respective one of the two bender-type piezoelectric drive members so that it can be operated in a push-pull manner and wherein the bender-type piezoelectric drive members are two element bender-type piezoelectric drive members each having two piezoelectric plate elements which are prepoled in opposite directions with each plate element being selectively excited with a direct current excitation field which is in-phase with the pre-poling electric field whereby substantially no depolarization of the piezoelectric plate elements occurs over prolonged periods of relay operation.

16. A direct current latching relay according to claim 15 wherein the selectively operable direct current electric excitation circuit means applies a pulsed direct current excitation field of short duration selectively and respectively to each piezoelectric plate element to initiate the snap-action switching of the relay contacts by the snap-action switch mechanism and subsequently automatically electrically discharges each electrically charged piezoelectric plate element following switching of the relay from one of its operating states to the other whereby substantially no undesired long term deformation of the piezoelectric bender-type drive member occurs over extended periods of relay use.

17. A direct current latching relay according to claim 16 there are a plurality of sets of two element bender-type piezoelectric drive members mechanically intercoupled to drive the push rod means in a push-pull manner.

18. A direct current latching relay according to claim 13 wherein the electrically actuated bender-type piezoelectric drive member is a multi-layer drive member comprised by a plurality of physically adjacent piezoelectric plate elements each of which is respectively electrically excited with direct a curren excitation signal field which is in-phase with the pre-poling field previously permanently induced in the piezoelectric plate element whereby substantially no depolarization of the piezoelectric plate elements occurs over prolonged periods of operation of the relay.

19. The method of actuating a direct current latching relay of the type having a latching-type snap-action switch mechanism including a set of electrical contacts that are selectively latched either in the open or the closed condition in a snap-action manner upon successive actuations of the snap-action switching mechanism by push-rod means for initiating actuation of the snap-action switch mechanism, said relay further including a pair of electrically actuated bender-type piezoelectric drive members each having one end secured to a common base member with latching-type snap-action switch mechanism and the remaining end engaging opposite ends of a push rod member operated in a linear push-pull manner; said method comprising selectively and simultaneously exciting one piezoelectric plate element of each bender-type drive member with a direct current excitation field only which is in-phase with the pre-poling electric field previously permanently induced in the piezoelectric plate element whereby substantially no depolarization of the piezoelectric plate element occurs as a result of successive operations of the relay to drive the push rod member in a desired direction when collectively bending in said direction.

20. The method according to claim 19 wherein a pulsed direct current excitation field of short duration selectively and simultaneously is applied to said plate elements to initiate the snap-action switching of the relay contacts by the snap-action switch mechanism and each of said electrically charged piezoelectric plate elements subsequently is automatically electrically discharged following switching of the relay from one of its operating states to the other whereby substantially no undesired long term deformation of the piezoelectric bender-type drive member occurs over extended periods of relay use.

21. The method according to claim 19 wherein a plurality of sets of bender-type piezoelectric drive members are mechanically interconnected and coact to drive the push rod means to thereby make available larger power-rated relays.

* * * * *